United States Patent
Consuelo et al.

(10) Patent No.: US 7,667,529 B2
(45) Date of Patent: Feb. 23, 2010

(54) CHARGE PUMP WARM-UP CURRENT REDUCTION

(76) Inventors: Orlando Consuelo, 003 Medina Sub., N., Guevarra St., Dasmarinas, Cavite 4114 (PH); Raymond Zeng, 129 Ashcat Way, Folsom, CA (US) 95630; Xiaoyan Lu, 454 27th Ave., San Francisco, CA (US) 94121

( * ) Notice: Subject to any disclaimer, the term of this patent is extended or adjusted under 35 U.S.C. 154(b) by 19 days.

(21) Appl. No.: 11/983,079

(22) Filed: Nov. 7, 2007

(65) Prior Publication Data

US 2009/0115494 A1    May 7, 2009

(51) Int. Cl.
G05F 1/10 (2006.01)
G05F 3/02 (2006.01)

(52) U.S. Cl. .................. 327/536; 327/156; 327/157; 331/17; 363/59

(58) Field of Classification Search .......... 327/141, 327/144–163, 563, 567, 536, 537; 331/15–17; 375/373–376; 363/59, 60
See application file for complete search history.

(56) References Cited

U.S. PATENT DOCUMENTS

| | | | |
|---|---|---|---|
| 6,169,444 B1 * | 1/2001 | Thurber, Jr. ................. 327/536 |
| 6,194,920 B1 * | 2/2001 | Oguri .......................... 327/65 |
| 6,538,930 B2 * | 3/2003 | Ishii et al. .............. 365/189.09 |
| 2002/0145892 A1 * | 10/2002 | Shor et al. .................... 363/59 |
| 2005/0093613 A1 * | 5/2005 | Nazarian et al. ............ 327/536 |
| 2008/0068056 A1 * | 3/2008 | Poulton et al. .............. 327/156 |

* cited by examiner

*Primary Examiner*—Lincoln Donovan
*Assistant Examiner*—Brandon S Cole
(74) *Attorney, Agent, or Firm*—Dana B. Lemoine; Leomoine Patent Services, PLLC

(57) ABSTRACT

A charge pump circuit includes a voltage controlled oscillator. The voltage controlled oscillator operates at a lower frequency during a warm-up mode, and operates at a higher frequency during a loading mode. The lower frequency operation during the warm-up mode reduces power supply current requirements.

6 Claims, 4 Drawing Sheets

CHARGE PUMP WARM-UP CURRENT REDUCTION

FIELD

The present invention relates generally to electronic circuits, and more specifically to charge pump circuits.

BACKGROUND

Charge pumps circuits are capable of generating voltages above or below available power supply voltages. For example, a charge pump may generate a voltage of five volts or more while operating from a three volt power supply.

When a charge pump is turned on, the charge pump consumes current while charging the output to the appropriate output voltage. If the charge pump charges the output quickly, an input current spike may result.

DESCRIPTION OF EMBODIMENTS

Figure 1:
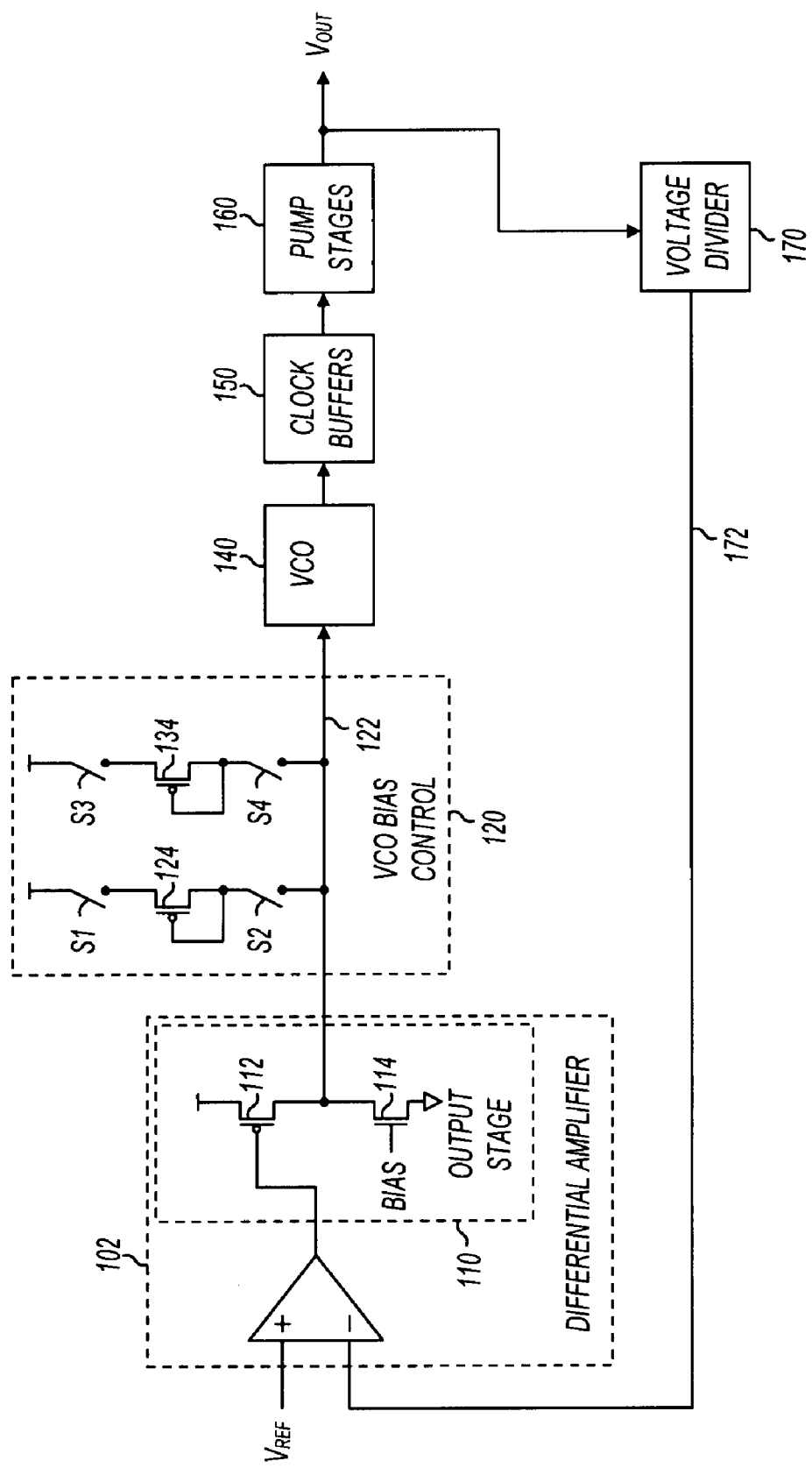
FIG. 1 shows a charge pump circuit.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a charge pump circuit. Charge pump circuit 100 includes voltage controlled oscillator (VCO) 140, clock buffers 150, pump stages 160, voltage divider 170, differential amplifier 102, and VCO bias control circuit 120. VCO 140 receives a signal on node 122 and provides an internal clock signal to clock buffers 150, which in turn provide clock signals to pump stages 160. Pump stages 160 may include one or more charge pump stages that pump charge in response to the clock signal. Pump stages 160 produce an output voltage $V_{OUT}$. VCO 140, clock buffers 150, and pump stages 160 may be implemented using circuit techniques known in the art.

The output voltage $V_{OUT}$ is provided to voltage divider 170, and voltage divider 170 provides a lesser voltage on node 172 to differential amplifier 102. Differential amplifier 102 compares the lesser voltage with a reference voltage $V_{REF}$. Differential amplifier 102 includes output stage 110. Output stage 110 includes transistors 112 and 114. Transistor 112 is shown as a p-type metal oxide semiconductor (PMOS) transistor, and transistor 114 is shown as an n-type metal oxide semiconductor (NMOS) transistor. The voltage on node 122 is a combination of the error signal voltage provided by differential amplifier 102 and a VCO bias voltage influenced by VCO bias control circuit 120.

VCO bias control circuit 120 includes two diode-connected transistors 124 and 134, and switches S1, S2, S3, and S4. Transistors 124 and 134 are referred to as "diode-connected" because their gate nodes are coupled to their respective drain nodes. When the four switches are closed, transistors 124 and 134 are coupled in parallel between a power supply node and node 122. When only S1 and S2 are closed, only transistor 124 is coupled between the power supply node and node 122. The bias voltage on node 122 is higher when both transistors 124 and 134 are coupled in parallel as compared to when only one of the transistors is coupled in the circuit.

The clock frequency of VCO 140 varies inversely with the bias voltage on node 122. Accordingly, when the bias voltage on node 122 is higher because both transistors 124 and 134 are coupled in parallel, the internal clock frequency of VCO 140 is lower than when only one of transistors 124 or 134 is in the circuit.

In some embodiments, charge pump circuit 100 operates in two distinct modes: 1) a warm-up mode; and 2) a loading mode. Warm-up mode is the mode when the charge pump is pumping voltage from a supply voltage to a higher desired regulated output voltage. Loading mode happens when the charge pump has charged up to the desired regulated output voltage and supplies AC/DC current to circuits. Output current of charge pumps is defined by $$I_{OUT} = C * \Delta V * f \quad (1)$$

where $I_{OUT}$=output current, C=pump capacitor, $\Delta V$=voltage gain between stages, and f=operating frequency. Charge pumps are usually designed to deliver an appropriate output current at loading mode. This is done by properly selecting the frequency of operation to deliver the appropriate output current as required by the expected load. In the circuit of FIG. 1, the frequency of operation is set by setting the bias voltage for VCO 140 on node 122.

Figure 3:
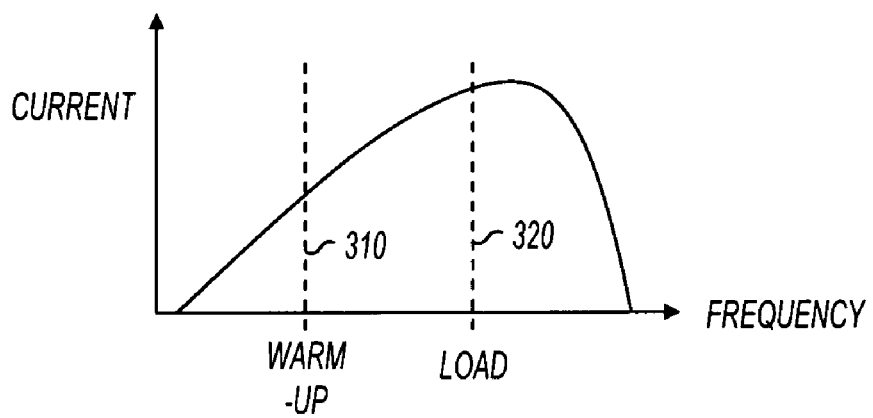
FIG. 3 shows a current vs. frequency curve.

In various embodiments of the invention, charge pump warm-up current reduction is achieved by decreasing the frequency to an acceptable value during warm-up mode and then configuring it back smoothly to an appropriate frequency setting during loading mode. FIG. 3 depicts the frequency settings during warm-up mode and loading mode with corresponding output current. Considering that the current efficiency of a charge pump is constant over frequency, output current decrease is proportional to input current decrease. This results in a decrease in the input warm-up current of the charge pump circuit in this configuration.

Figure 2:
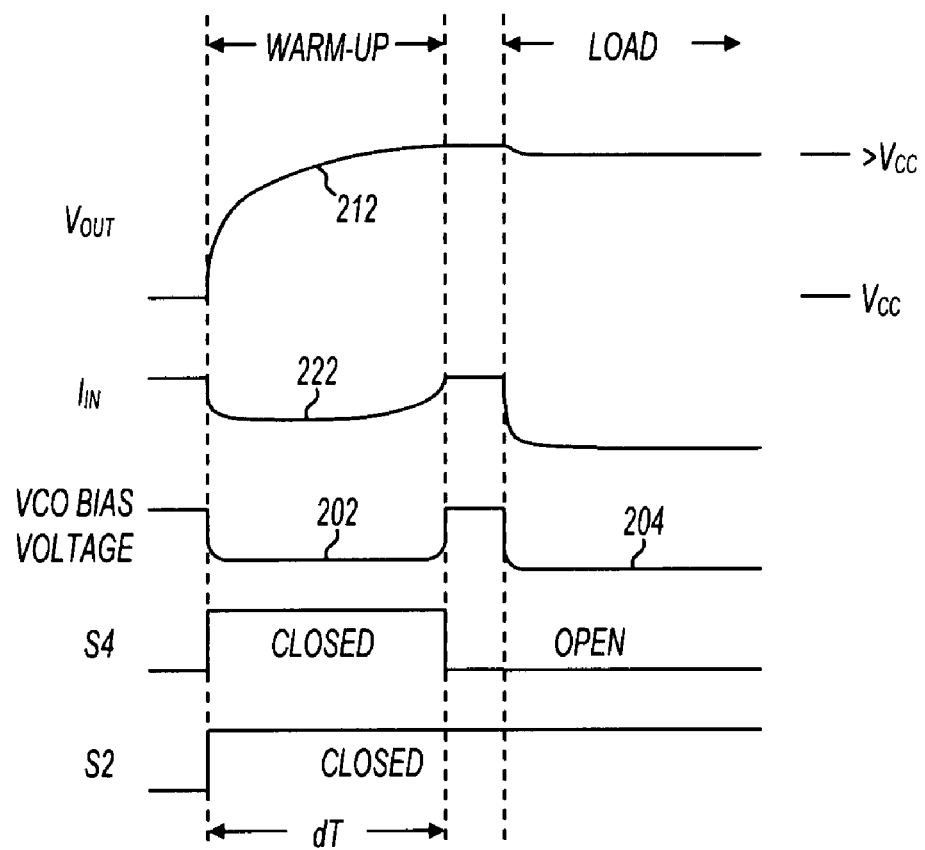
FIG. 2 shows signal waveforms illustrating the operation of the charge pump circuit of FIG. 1.

FIG. 2 shows signal waveforms illustrating the operation of the charge pump circuit of FIG. 1. During charge pump warm-up, S2 and S4 are both closed, providing a VCO bias voltage as shown at 202. For this bias voltage, the VCO operates at a frequency corresponding to 310 (FIG. 3). Also during warm-up, the output voltage ramps up at 212 with an input current shown at 222. When the warm-up is complete, switch S4 is opened. When a load is applied, the VCO bias voltage is as shown at 204. For this bias voltage, the VCO operates at a frequency corresponding to 320 (FIG. 3).

Transistors 124 and 134 (FIG. 1) are in parallel during warm-up to pull-up the bias voltage to slow down the frequency of the VCO to an acceptable value. The acceptable frequency is the corresponding output current that: (1) can charge the output load or capacitance of the pump to the desired regulated value in a specified time acceptable to applications, and (2) decreases the input warm-up current to an acceptable value. The time it takes to reach the desired regulated output voltage is warm-up time and it is the time delay (dT) needed in delay circuit or timing logic to switch S4. Once warm-up time is complete, only transistor 124 controls the bias voltage configuring the charge pump back to its operational frequency setting.

Figure 4:
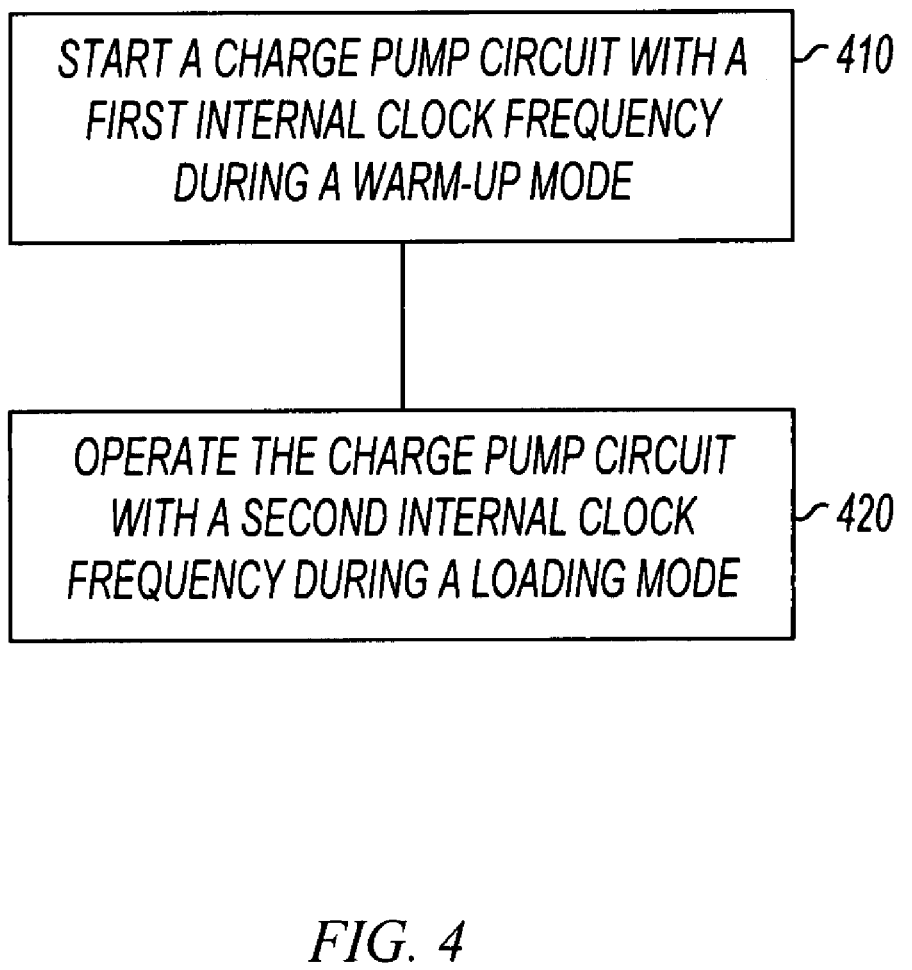
FIG. 4 shows a flowchart in accordance with various embodiments of the present invention.

FIG. 4 shows a flowchart in accordance with various embodiments of the present invention. In some embodiments, method 400, or portions thereof, is performed within a charge pump circuit. In other embodiments, method 400 is performed by a memory device, an integrated circuit, or an electronic system. Method 400 is not limited by the particular type of apparatus or software performing the method. The various actions in method 400 may be performed in the order presented, or may be performed in a different order. Further, in some embodiments, some actions listed in FIG. 4 are omitted from method 400.

Method 400 is shown beginning with block 410 in which a charge pump circuit is started with a first internal clock frequency during a warm-up mode. In some embodiments, this is achieved by providing parallel diode-connected transistors to a VCO bias node to raise a bias voltage.

At 420, the charge pump circuit is operated with a second internal clock frequency during a loading mode. In some embodiments, the charge pump circuit switches from the warm-up mode to the loading after a specified time delay (dT). In other embodiments, the charge pump circuit switches from the warm-up mode to the loading mode after an output voltage reaches a threshold value.

In some embodiments, the first internal clock frequency is lower than the second internal clock frequency. As a result of the lower first internal clock frequency, input current requirements are reduced during the warm-up mode as compared to the loading mode.

Figure 5:
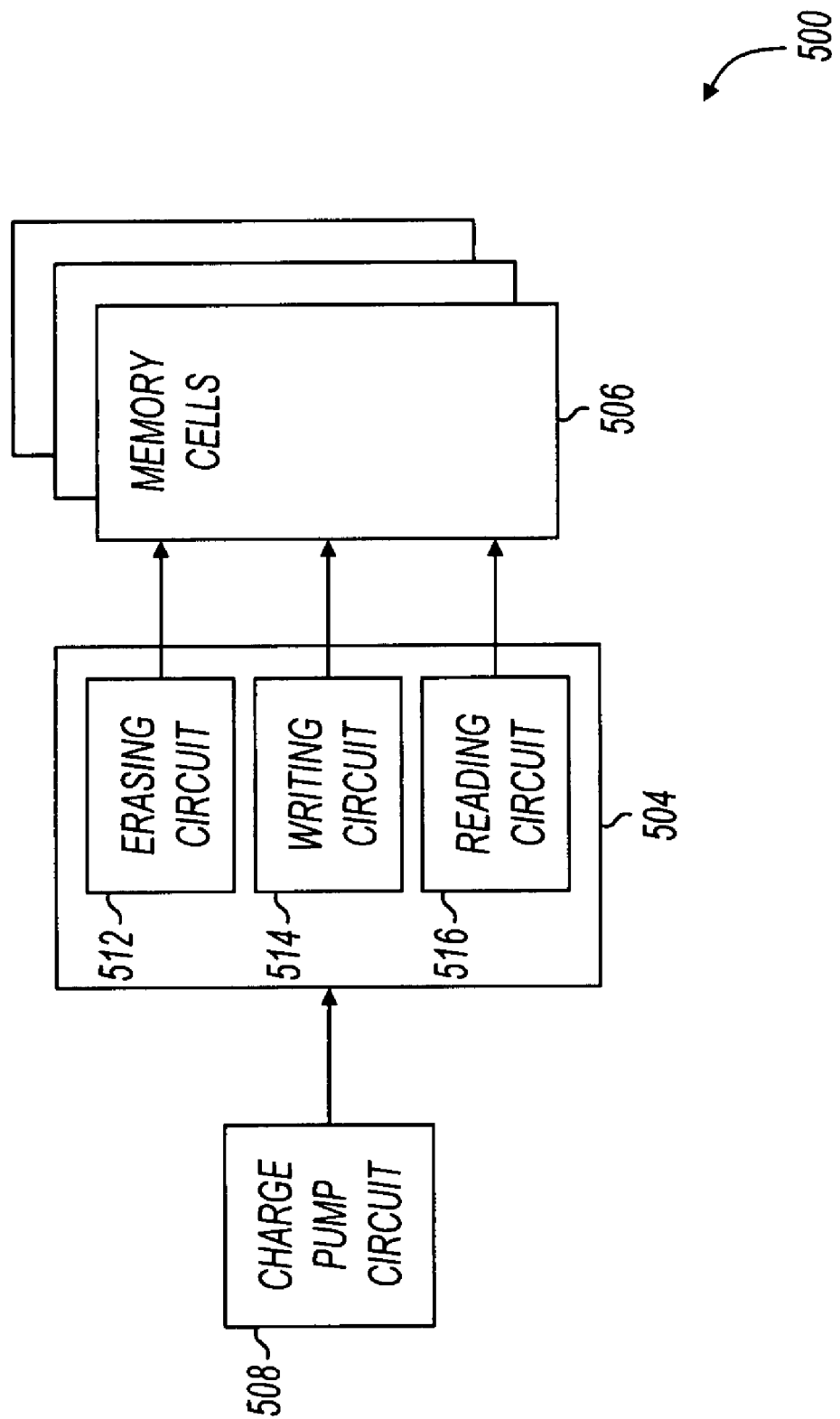
FIG. 5 shows a memory device.

FIG. 5 shows a memory device. Memory device 500 includes memory cells 506, control circuits 504, and charge pump circuit 508. Charge pump circuit 508 may be a charge pump circuit with bias circuitry to allow different internal clock frequencies for warm-up and loading. For example, charge pump circuit 508 may be implemented as charge pump circuit 100 (FIG. 1).

Control circuits 504 include erasing circuit 512, writing circuit 514, and reading circuit 516. Any of the control circuits may utilize a voltage provided by charge pump circuit 508. In some embodiments, multiple charge pump circuits are included, and the various control circuits utilize different voltages for different operations.

In some embodiments, memory cells may be electrically erasable programmable read only memory (EEPROM), commonly referred to as FLASH memory. The use of high and low voltages for writing and erasing FLASH memory cells are generally known.

In some embodiments, memory device 500 is a memory that can perform multiple operations simultaneously. For example, memory device 500 may be able to perform simultaneous read and write operations. In these applications, read and write mode are supported simultaneously and high current charge pumps are may be utilized to support the fast write performance. During the write algorithm, high current charge pumps are used and implementing the various embodiments of the present invention allow warming-up of the pumps without causing the VCC supply to droop that can cause read failure.

Memory device 500 may be a packaged integrated circuit or an unpackaged integrated circuit die. For example, memory device 500 may be a packaged integrated circuit that includes an interface to allow it to be used as part of an electronic system. Also for example, memory device 500 may be included in a packaged integrated circuit that also includes other components, functional blocks, integrated circuit dice, or subsystems. Further, in some embodiments, memory device 500 may be sold as an unpackaged integrated circuit die.

Although the present invention has been described in conjunction with certain embodiments, it is to be understood that modifications and variations may be resorted to without departing from the scope of the invention as those skilled in the art readily understand. Such modifications and variations are considered to be within the scope of the invention and the appended claims.

What is claimed is:

1. A charge pump comprising:
    a voltage controlled oscillator (VCO) to produce a clock signal having a variable frequency in response to an error signal;
    a pump stage to produce an output voltage in response to the clock signal;
    a differential amplifier to produce the error signal in response to the output voltage and a reference voltage; and
    a bias circuit to bias the VCO by modifying a DC voltage component of the error signal, the bias circuit capable of commanding a lower nonzero VCO output frequency during a warm-up mode and a higher nonzero VCO frequency during a loading mode, wherein the bias circuit includes at least one diode-connected transistor to modify the DC voltage component of the error signal, the bias circuit further includes two diode-connected transistors and two switches to conditionally couple the two diode-connected transistors to an output node of the differential amplifier, and wherein the two switches are closed during the warm-up mode, and only one of the switches is closed during the loading mode.

2. The charge pump of claim 1 wherein the differential amplifier comprises an output stage with an NMOS load device.

3. The charge pump of claim 2 wherein the two diode-connected transistors and two switches form a plurality of current paths to modify a DC current through the NMOS load device.

4. A method comprising:
    starting a charge pump circuit with a first nonzero internal clock frequency during a warm-up mode by biasing an error signal fed from an output node of an error amplifier to a voltage controlled oscillator (VCO) with a first DC voltage by closing two switches coupled to the output node of the error amplifier; and
    operating the charge pump circuit with a second nonzero internal clock frequency during a loading mode by biasing the error signal fed to the VCO with a second DC voltage by closing one of the two switches coupled to the output of the error amplifier.

5. The method of claim 4 wherein the first nonzero internal clock frequency is lower than the second nonzero internal clock frequency.

6. The method of claim 4 further comprising supplying a charge pump output voltage to a circuit within a flash memory device.

* * * * *